US008574961B2

(12) United States Patent
Knapp et al.

(10) Patent No.: US 8,574,961 B2
(45) Date of Patent: Nov. 5, 2013

(54) METHOD OF MARKING A LOW PROFILE PACKAGED SEMICONDUCTOR DEVICE

(75) Inventors: James Howard Knapp, Gilbert, AZ (US); Jay A. Yoder, Phoenix, AZ (US); Harold G. Anderson, Chandler, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 1172 days.

(21) Appl. No.: 10/548,563

(22) PCT Filed: Apr. 29, 2003

(86) PCT No.: PCT/US03/13027
§ 371 (c)(1),
(2), (4) Date: Sep. 9, 2005

(87) PCT Pub. No.: WO2004/100255
PCT Pub. Date: Nov. 18, 2004

(65) Prior Publication Data
US 2006/0134836 A1    Jun. 22, 2006

(51) Int. Cl.
*H01L 21/56*     (2006.01)
*H01L 21/683*    (2006.01)
*H01L 23/49*     (2006.01)

(52) U.S. Cl.
USPC ........... 438/112; 438/114; 438/119; 438/617; 257/676; 257/784; 257/690

(58) Field of Classification Search
USPC .................. 438/118, 106, 112, 110, 119, 127, 438/FOR. 106, FOR. 366, FOR. 367, 438/FOR. 369, 121, 123, 124; 257/E21.499, 257/E21.502, E21.506, E21.514
See application file for complete search history.

(56) References Cited

U.S. PATENT DOCUMENTS

| | | | |
|---|---|---|---|
| 5,029,418 A * | 7/1991 | Bull | 451/41 |
| 5,140,404 A * | 8/1992 | Fogal et al. | 257/783 |
| 5,319,242 A | 6/1994 | Carney et al. | H01L 23/48 |
| 5,589,408 A * | 12/1996 | Robb et al. | 438/273 |
| 5,708,419 A * | 1/1998 | Isaacson et al. | 340/572.5 |
| 5,894,108 A * | 4/1999 | Mostafazadeh et al. | 174/529 |
| 5,976,912 A * | 11/1999 | Fukutomi et al. | 438/110 |
| 6,001,671 A * | 12/1999 | Fjelstad | 438/112 |
| 6,069,408 A | 5/2000 | Honda et al. | |
| 6,126,885 A | 10/2000 | Oida et al. | |
| 6,258,632 B1 * | 7/2001 | Takebe | 438/127 |
| 6,294,100 B1 * | 9/2001 | Fan et al. | 216/14 |
| 6,337,510 B1 | 1/2002 | Chun-Jen et al. | H01L 23/495 |
| 6,489,218 B1 * | 12/2002 | Kim et al. | 438/460 |
| 6,528,893 B2 | 3/2003 | Jung et al. | H01L 23/28 |

(Continued)

FOREIGN PATENT DOCUMENTS

KR    2002-0031717    *    5/2002    ............. H01L 21/48

*Primary Examiner* — Olik Chaudhuri
*Assistant Examiner* — Quovaunda Jefferson
(74) *Attorney, Agent, or Firm* — Kevin B. Jackson

(57) ABSTRACT

A semiconductor device (10) is made by mounting the bottom surfaces (31, 44, 54) of a semiconductor die (14) and a lead (15, 17) on a tape (12) and over a hole (19) in the tape. A vacuum is drawn through the hole to secure the die in place when the lead's top surface (43) is wirebonded to a top surface (32) of the semiconductor die. A molding material (49) is formed to encapsulate the top surface of the semiconductor die and to expose its bottom surface.

10 Claims, 3 Drawing Sheets

(56) References Cited

U.S. PATENT DOCUMENTS

| | | | |
|---|---|---|---|
| 2002/0100163 A1* | 8/2002 | Hu et al. | 29/827 |
| 2005/0062172 A1* | 3/2005 | Low et al. | 257/787 |
| 2005/0206014 A1* | 9/2005 | Sakamoto et al. | 257/782 |
| 2008/0237857 A1* | 10/2008 | Low et al. | 257/741 |

* cited by examiner

METHOD OF MARKING A LOW PROFILE PACKAGED SEMICONDUCTOR DEVICE

BACKGROUND OF THE INVENTION

The present invention relates in general to semiconductor devices and, more particularly, to semiconductor dice housed in low profile packages.

There is a continuing demand for electronic systems with a higher functionality and smaller physical size. For example, successive generations of personal computers are specified to utilize motherboards of a decreasing while incorporating more features and operating at lower voltages but a higher power consumption. The power requirements often are met by using multiple local voltage regulators located at several locations on each motherboard.

The multiple voltage regulators typically are implemented as switching regulators that include an integrated control circuit and, to accommodate the high current levels, multiple parallel-connected discrete power switching transistors. A problem with this arrangement is that with each generation the multiple power switching transistors occupy larger portions of smaller motherboards, which reduces the area available for implementing other functions.

Some previous power transistors connect their semiconductor dice to package leads using wirebonds, but do not mount the dice on die attach flags. These devices have poor yields, and a resulting high cost, because the die is not adequately secured in position during the wirebond process.

Hence, there is a need for a packaged semiconductor device that has a small physical size and high efficiency to alleviate the above mentioned problems.

DETAILED DESCRIPTION OF THE DRAWINGS

In the figures, elements having the same reference number have a similar structure and functionality. Similar elements associated with a particular reference number may be described in either the plural or general sense or in the singular or specific sense, depending on the context.

Figure 1:
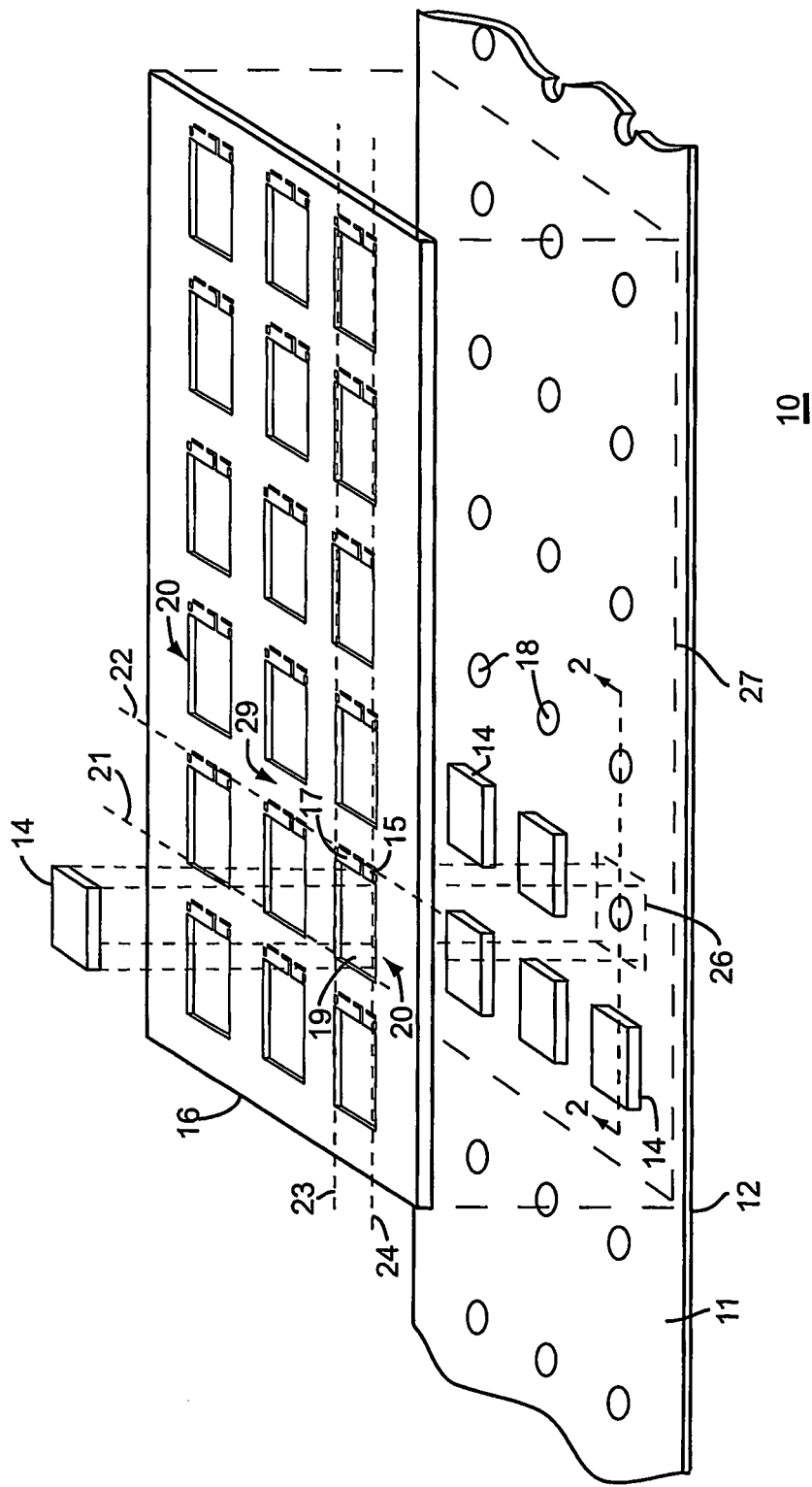
FIG. 1 is an exploded isometric view of a semiconductor device during a first stage of fabrication.

FIG. 1 is an exploded isometric view of a semiconductor device 10 being assembled on a mounting tape 12 at a first fabrication stage. Semiconductor device 10 is formed with a leadframe or leadframe matrix 16 and one or more semiconductor chips or dice 14. In one embodiment, semiconductor dice 14 are substantially identical semiconductor substrates on which standard semiconductor wafer processes are performed to produce a plurality of power transistors.

Mounting tape 12 comprises a standard semiconductor package assembly tape having an adhesive surface 11 for holding mounted components in position during the assembly process. An array of holes 18 are punched or otherwise formed in tape 12 at predefined locations determined by the package size and other factors. Holes 18 may be formed in situ with a computer-controlled hole punch apparatus just prior to mounting package components, or may be purchased commercially in a pre-punched form from a tape manufacturer or vendor. Tape 12 preferably is formed with materials that can withstand the temperatures needed to complete the package assembly. For example, in one embodiment, the highest temperature occurs during the encapsulation process during which an epoxy-based or plastic mold compound is dispensed and cured at a temperature of about one hundred eighty degrees Celsius. In one embodiment, tape 12 is made of a polyester-backed acrylic adhesive and formed with holes 18 of a diameter of about one thousand five hundred micrometers. Alternatively, tape 12 may comprise silicone and/or acrylic adhesive with a polyester, polyimide or polytetrafluoroethylene (PTFE) backing. Tape 12 may also be formed with an adhesive material applied to a metal foil such as an aluminum foil.

Leadframe matrix 16 has an X-Y array of regions that define individual leadframes, including a leadframe 20 defined by singulation along cut lines 21-24 and severed after assembly to form a plurality of packaged integrated circuits or transistors. In the embodiment of FIG. 1, leadframe matrix 16 is patterned such that, for example, leadframe 20 is formed with leads 15 and 17 and an opening 19. A region 29 between adjacent leadframes functions as a tie bar to maintain the position of leads 15 and 17 in relation to opening 19 during assembly. In one embodiment, leadframe matrix 16 is stamped or etched from a sheet of rolled copper having a thickness in a range between about one hundred and five hundred micrometers and a typical thickness of about two hundred micrometers. Leadframe matrix 16 is mounted on a region 27 of adhesive surface 11, with openings 19 aligned with regions 26 of mounting tape 12 that are generally centered around holes 18. Hence, leadframe matrix 16 is mounted directly on adhesive surface 11 so that holes 18 are exposed or visible through openings 19.

Openings 19 have a larger area than the area of semiconductor dice 14 to allow a standard pick-and-place apparatus (not shown) to mount semiconductor dice 14 directly on adhesive surface 11 within openings 19 and over holes 18. The size of openings 19 is selected taking into account the die size, the requirements of the pick-and-place apparatus and any alignment tolerance necessary for a saw or other singulation tool to avoid damaging dice 14 during the subsequent singulation process.

Figure 2:
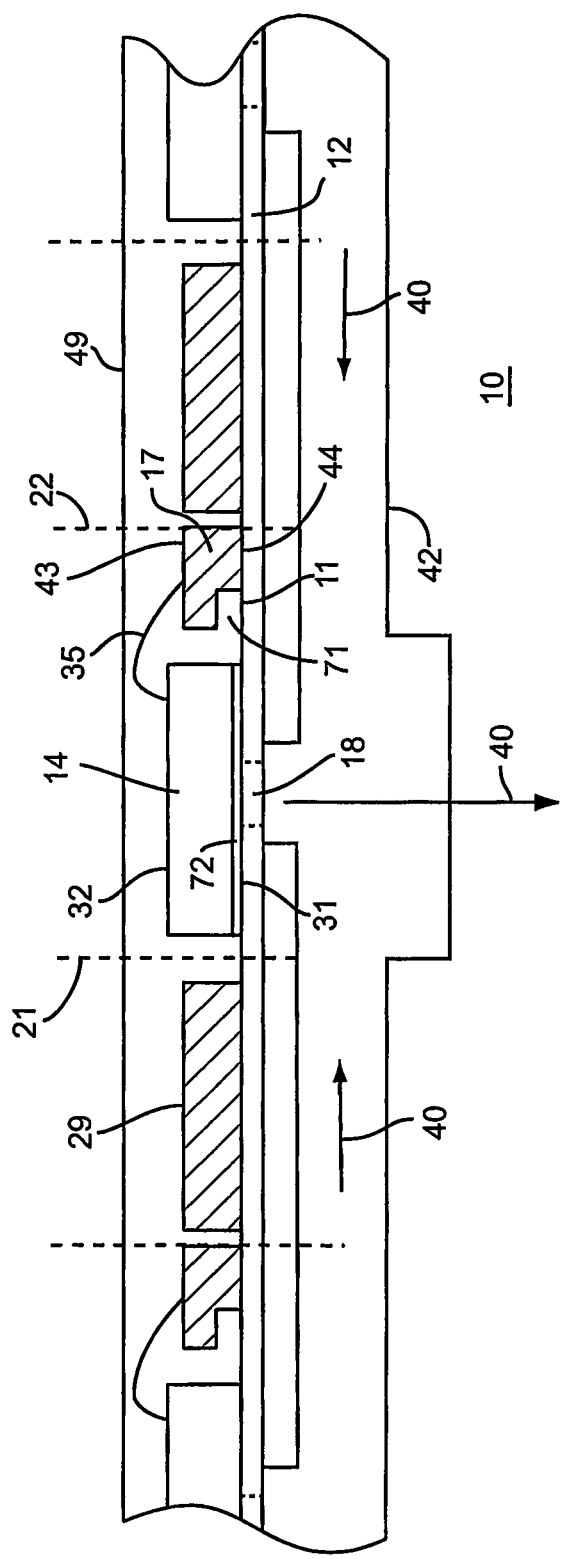
FIG. 2 is a cross-sectional side view of the semiconductor device and a portion of an assembly apparatus at a second stage of fabrication.

FIG. 2 is a cross-sectional side view of semiconductor device 10 after a second fabrication stage, and showing tape 12 mounted on a portion of an assembly apparatus that includes a vacuum system 42.

A vacuum pump (not shown) pulls a vacuum in a direction indicated by arrows 40 through ducts of vacuum system 42 to produce a low pressure at holes 18 for securing the positions of semiconductor dice 14 and compensating for any elasticity or movement of tape 12 during subsequent wirebonding. Once the vacuum is drawn, a wirebonding machine attaches bonding wires 35 from a top surface 43 of lead 17 to a top surface 32 of semiconductor die 14. Similar wire bonds are attached from lead 15 to top surface 32 as shown and described below.

After wirebonding, semiconductor device 10, with tape 12 attached, is placed on the floor of a molding chamber (not shown) into which is introduced a molding material 49 such as a plastic material or thermoset epoxy. Molding material 49 is formed as a continuous body that encapsulates top surfaces 32 of semiconductor dice 14, top surfaces 43 of leads 17 and the top surfaces of leads 15 (not shown in FIG. 2). Tape 12 is secured to surfaces of semiconductor device 10 so as to block molding material 49 from seeping through to reach holes 18, thereby preventing mold flash from forming on bottom surface 31 of semiconductor dice 14.

Bottom surface 31 of semiconductor die 14 is formed during wafer processing with a solderable layer 72 for mechanically and electrically attaching to an external surface. Bottom surfaces 31, bottom surfaces 44 of leads 17 and bottom surfaces 54 of leads 15 (shown in FIGS. 3-4) are attached to tape 12 during the encapsulation or molding process and, as a consequence, are masked by tape 12 to prevent their being covered by molding material 49. Hence, bottom surfaces 31, 44 and 54 are exposed for making external electrical and mechanical connections after tape 12 is removed. If necessary, semiconductor device 10 is subjected to a cleaning process to remove any residue of tape 12 or its adhesive material to ensure that bottom surfaces 31, 44 and 54 are fully exposed and free of material that could prevent or reduce electrical contact to external surfaces.

Note that leadframe matrix 16 is subjected to a half-etch or similar process to form mold locks 71 that prevent molding material 49 from separating from leads 15 and 17 during subsequent processing or while semiconductor device 10 is being used or operated. In one embodiment, mold locks 71 have a generally rectangular reentrant shape as shown.

Leads 15 and 17, and in fact leadframe matrix 16, are made to a thickness less than the thickness of semiconductor dice 14. For example, in one embodiment, semiconductor dice 14 have a thickness of about two hundred micrometers, while leads 15 and 17 have a thickness of about one hundred twenty-five micrometers. This thickness difference allows bonding wires 35 to be formed with a small loop height to reduce the overall thickness or height of semiconductor device 10. In an embodiment in which semiconductor dice 14 have a thickness of two hundred micrometers, the loop height is about four hundred eighty micrometers from the peak of bonding wires 35-36 to top surface 32 of semiconductor die 14, and the overall height of semiconductor device 10 is about eight hundred micrometers.

Figure 3:
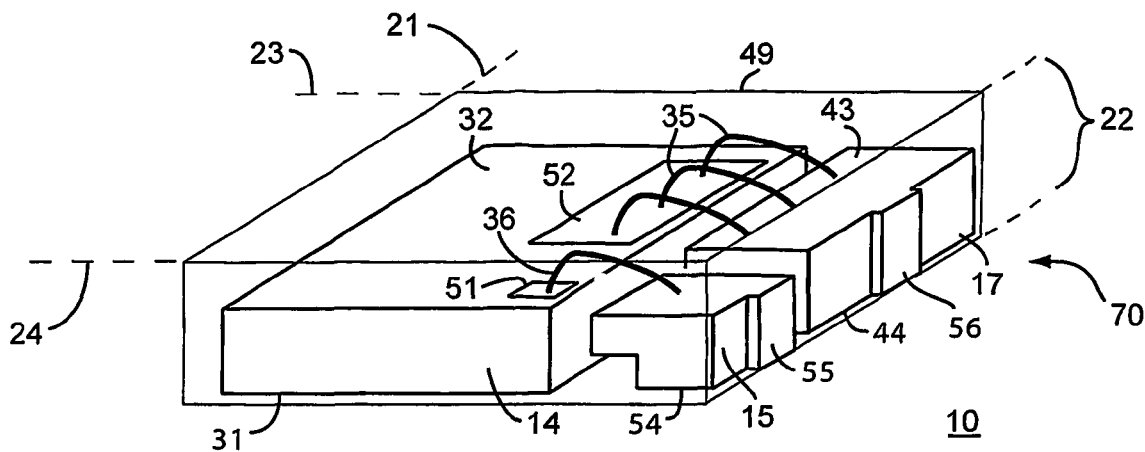
FIG. 3 is an isometric view of the semiconductor device after completion of a singulation process.

FIG. 3 is an isometric view of semiconductor device 10 after removing tape 12 and sawing along cut lines 21-24 to complete the singulation process. In one embodiment, semiconductor die 14 is configured as a power transistor operating at a specified source-drain current greater than one ampere and housed in a singulated package 70 that includes leads 15 and 17, bonding wires 35 and 36 and molding material 49.

Semiconductor die 14 has a gate electrode coupled to a gate bonding pad 51 and a source electrode coupled to a source bonding pad 52, both formed on top surface 32 of semiconductor die 14. Solderable layer 72 is formed on bottom surface 31 during wafer processing to function as a drain terminal. In one embodiment, solderable layer 72 is formed with a titanium-nickel-silver alloy. Bottom surface 31 is exposed, i.e., not encapsulated by molding material 49, so solderable layer 72 allows bottom surface 31 to function as a package lead that can be attached by a solder reflow or other process for making external connections.

Where semiconductor device 10 comprises a vertical power transistor, multiple bonding wires 35 are attached in parallel between source bonding pad 52 and top surface 43 of lead 17 to reduce the on-resistance. The gate current is transient in nature and generally of a lower amplitude, so a single bonding wire 36 attached between gate bonding pad 51 and lead 15 is generally adequate to ensure a high performance.

Note that bottom surface 31 of semiconductor die 14, bottom surface 44 of lead 17 and a bottom surface 54 of lead 15 are all coplanar and exposed from molding material 49 to facilitate external connectivity.

Tabs 55-56 project from leads 15 and 17, respectively, and are remnants of the tie bar of region 29, remaining on leads 15 and 17 as artifacts of the sawing or singulation process.

The exposure of bottom surface 31 of semiconductor die 14 and the reduced loop height of bonding wires 35-36 provide package 70 of semiconductor device 10 with a low profile. In one embodiment, semiconductor device 10 has an overall height of about eight hundred micrometers.

Figure 4:
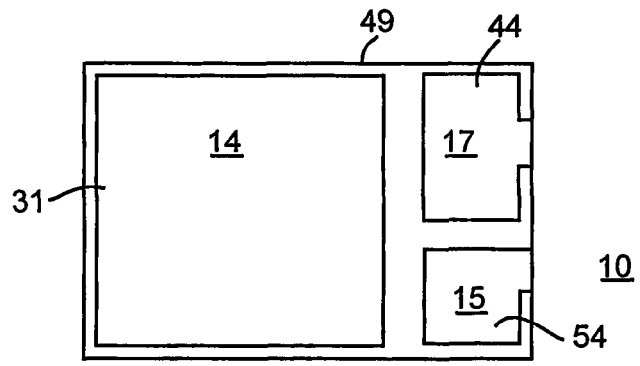
FIG. 4 is a bottom view of the semiconductor device.

FIG. 4 is a bottom view of semiconductor device 10 showing bottom surface 31 of semiconductor die 14 as being exposed for making external electrical connections along with bottom surface 54 of lead 15 and bottom surface 44 of lead 17. Bottom surfaces 31, 44 and 54 are all coplanar.

Figure 5:
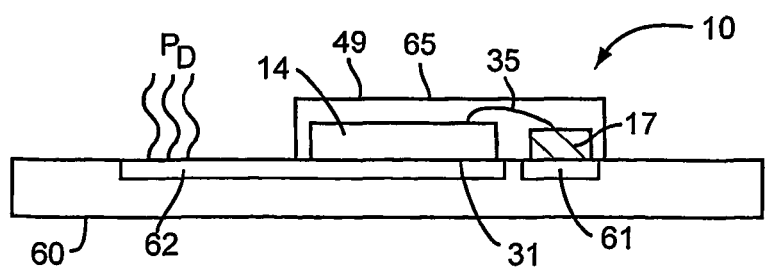
FIG. 5 is a cross-sectional side view of a portion of an electrical system including the semiconductor device.

FIG. 5 shows a cross-sectional side view of a portion of an electronic system, including semiconductor device 10 mounted on a motherboard 60.

Motherboard 60 is formed with a trace 61 to which is attached lead 17 and a trace 62 for attaching to bottom surface 31 of semiconductor die 14. In one embodiment, lead 17 and bottom surface 31 are attached to traces 61-62 by reflow soldering.

The exposure of bottom surface 31 of semiconductor die 14 results in a low thermal resistance since heat does not flow through a die attach pad and its associated metallurgical junctions as in other packaged devices. This benefit is particularly apparent in an embodiment in which a large portion of the power is generated throughout the bulk of semiconductor die 14, rather than at top surface 32.

Thermal resistance is further reduced by the low package profile of semiconductor device 10 because of the short distance from semiconductor die 14 to a top surface 65 of molding material 49. In some applications, it is advantageous to mount an external heat sink (not shown) to top surface 65 to further aid in dissipating power. Note also that trace 62 is formed to extend outwardly from semiconductor device 10. This arrangement exposes a portion of trace 62 to ambient air currents to further facilitate the removal of power PD dissipated by semiconductor device 10.

Moreover, by mounting bottom surface 31 of semiconductor die 14 directly to trace 62, the electrical resistance is reduced since the distance from trace 62 to bottom surface 31 is virtually zero. Indeed, current flows from the bulk substrate of semiconductor die 14 through solderable layer 72 directly to trace 62. Hence, current flowing through semiconductor device 10 encounters no die attach flag and flows through fewer metallurgical junctions, which results in a lower on-resistance than is the case with other devices. The lower on-resistance provides a high performance and efficiency by further reducing the dissipated power $P_D$.

By now it can be seen that the present invention provides a packaged semiconductor device with a low profile and a low electrical and thermal resistance. A lead has a first surface for wirebonding to a first surface of a semiconductor die and a second surface substantially coplanar with a second surface of the semiconductor die. A molding material encapsulates the first surface of the semiconductor die and exposes the second surface of the semiconductor die. The semiconductor die and lead are disposed on a mounting tape to maintain their position during the packaging assembly process. The semiconductor die is secured during package assembly by positioning over a hole in the mounting tape and applying a vacuum through the hole to obviate any movement or elasticity in the mounting tape while pressure is applied to the die by the wirebonding tool during the wirebonding process.

The present invention provides a packaged semiconductor device with a high reliability and low cost. Because the semiconductor die is exposed to function as a lead, there is no die attach pad and therefore no solder reflow die attach process is needed. Hence, the semiconductor device can be assembled in a wider variety of manufacturing locations and at a lower cost. Moreover, fewer dissimilar component materials and therefore fewer dissimilar temperature coefficients of expansion within the semiconductor device. Consequently, internal stresses are reduced and reliability enhanced. Finally, the semiconductor device can be formed with a smaller footprint because there is no need to align and mount the semiconductor die on a die attach pad that is made larger to avoid die overhang.

What is claimed is:

1. A method of making a semiconductor device, comprising:
    providing a semiconductor die having first and second opposed surfaces, wherein the semiconductor die has a solderable metal layer formed overlying the second surface;
    providing a tape having an adhesive surface and a hole extending completely through the tape;
    mounting the semiconductor die on the adhesive surface of the tape, wherein the semiconductor die covers the hole and a portion of the solderable metal layer is exposed through the hole;
    drawing a vacuum through the hole to secure the semiconductor die;
    attaching a wirebond to the first surface of the semiconductor die and to a lead disposed on the tape while drawing the vacuum;
    forming an encapsulating layer overlying the wirebond, at least a portion of the lead and at least a portion of the semiconductor die while the tape is attached to the solderable metal layer; and
    removing the tape so that surfaces of the lead and the solderable metal layer are exposed to provide package leads, wherein the exposed solderable metal layer provides an electrical contact for the semiconductor device when the semiconductor device is mounted to an electronic system.

2. The method of claim 1, wherein the step of mounting the semiconductor die includes mounting the semiconductor die to a tape comprising metal foil having an adhesive material applied thereto.

3. The method of claim 1, wherein the step of mounting the semiconductor die includes mounting the semiconductor die over a single hole in the tape.

4. The method of claim 1, further comprising the step of singulating through the encapsulating layer and a portion of the lead to provide a packaged semiconductor device.

5. The method of claim 1, further comprising the step of attaching a leadframe having at least one opening and including the lead to the adhesive surface of the tape, wherein the solderable metal layer and a surface of the lead are coplanar and wherein the semiconductor die is positioned in the opening of the leadframe.

6. A method of making a semiconductor device, comprising:
    providing a tape having an adhesive surface and a hole extending completely through the tape;
    mounting a leadframe having a conductive lead to the adhesive surface, wherein the leadframe has an opening surrounding the hole;
    mounting a first surface of a semiconductor die to the adhesive surface so that the semiconductor die is within the opening and covers the hole, wherein the first surface comprises a solderable metal layer formed overlying the semiconductor die;
    drawing a vacuum through the hole to secure the semiconductor die while attaching a first end of a bonding wire to a second surface of the semiconductor die and a second end of the bonding wire to the conductive lead;
    encapsulating the bonding wire and the second surface of the semiconductor die and a second surface the conductive lead with an encapsulant;
    exposing a first surface of the lead and the solderable metal through the encapsulant to provide package leads, wherein the solderable metal layer is configured as an electrical contact for semiconductor device when the semiconductor device is mounted to an electronic system; and
    singulating through the encapsulant and a portion of the leadframe.

7. The method of claim 6, wherein the step of mounting the semiconductor die includes mounting the semiconductor die so that a first surface of the lead is in a plane with the first surface of the semiconductor die, and wherein both first surfaces are adjacent the adhesive surface.

8. The method of claim 6, the step of mounting the first surface of the semiconductor die includes mounting the first surface of the semiconductor die over only one hole in the tape.

9. The method of claim 6, wherein the step of exposing includes covering the first surfaces of the semiconductor die and the conductive lead with the tape to block the encapsulant.

10. The method of claim 6, wherein the step of providing the tape includes providing a tape comprising metal foil having an adhesive material applied thereto.

* * * * *